United States Patent
Blaesing-Bangert et al.

(10) Patent No.: US 6,816,253 B1
(45) Date of Patent: Nov. 9, 2004

(54) SUBSTRATE HOLDER, AND USE OF THE SUBSTRATE HOLDER IN A HIGHLY ACCURATE MEASURING INSTRUMENT

(75) Inventors: Carola Blaesing-Bangert, Huettenberg (DE); Ulrich Kaczynski, Bad Nauheim (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 383 days.

(21) Appl. No.: 09/685,772

(22) Filed: Oct. 11, 2000

(30) Foreign Application Priority Data

Oct. 11, 1999  (DE) .......................................... 199 48 797

(51) Int. Cl.⁷ ........................ G01N 21/01; G01B 11/02; G01B 11/00; G03B 27/58; G03B 27/62
(52) U.S. Cl. ...................... 356/244; 356/503; 356/511; 356/401; 355/72; 355/75; 378/35
(58) Field of Search ................................ 356/244, 503, 356/511, 401; 355/72, 75; 378/34–35; 310/10, 12

(56) References Cited

U.S. PATENT DOCUMENTS

| | | | |
|---|---|---|---|
| 4,549,843 A | * 10/1985 | Jagusch et al. | ........ 414/416.01 |
| 4,583,847 A | * 4/1986 | Battig et al. | .................. 355/53 |
| 4,609,285 A | * 9/1986 | Samuels | ...................... 355/75 |
| 4,655,594 A | * 4/1987 | Wittekoek et al. | .......... 356/500 |
| 4,924,258 A | * 5/1990 | Tsutsui | ......................... 355/53 |
| 5,539,521 A | 7/1996 | Otokake et al. | |
| 5,608,773 A | * 3/1997 | Korenaga et al. | ............ 378/34 |
| 5,671,054 A | 9/1997 | Iwasaki | |
| 5,786,897 A | * 7/1998 | Ototake | ...................... 356/511 |
| 5,894,056 A | * 4/1999 | Kakizaki et al. | ............... 430/5 |
| 5,959,731 A | * 9/1999 | Jones | ......................... 356/503 |

FOREIGN PATENT DOCUMENTS

| | | |
|---|---|---|
| EP | 0 702 206 | 3/1996 |
| EP | 1014030 A1 | 6/2000 |
| WO | WO 99/57508 | 11/1999 |

OTHER PUBLICATIONS

*SPIE*, vol. 3096–0277–786X/97, pp. 433–444 entitled "Advanced Mask Metrology System for up to 4Gbit DRAM" by Taro Ototake et al.

* cited by examiner

*Primary Examiner*—Rodney Fuller
*Assistant Examiner*—Magda Cruz
(74) *Attorney, Agent, or Firm*—Crowell & Moring LLP

(57) ABSTRACT

The invention discloses a substrate holder (8) that is configured to receive a substrate (20) and can be utilized to determine the thickness deviation of a substrate from the standard thickness of a specific substrate type. The substrate holder (8) comprises a one-piece frame having a flat upper surface (42). An opening (30) that defines a peripheral rim (32) is provided in the substrate holder (8). Receiving elements (34) on which spheres are provided are shaped onto the peripheral rim (32) of the opening (30). A substrate (20) placed into the substrate holder (8) thus comes to rest on the upper surfaces of the spheres. The support elements (34) are arranged on the peripheral rim of the opening (30) in such a way that they lie at the vertices of an equilateral triangle. In addition, the spacing from the upper surface of the spheres to the flat upper surface (42) of the substrate holder (8) is dimensioned such that said spacing corresponds substantially to the standard thickness of the substrate type being used.

21 Claims, 4 Drawing Sheets

SUBSTRATE HOLDER, AND USE OF THE SUBSTRATE HOLDER IN A HIGHLY ACCURATE MEASURING INSTRUMENT

CROSS REFERENCE TO RELATED APPLICATIONS

This invention claims priority of a German filed patent application DE-A-199 48 797.9.

FIELD OF THE INVENTION

This invention concerns a substrate holder and the use of the substrate holder according to the present invention in a highly accurate measuring instrument. The invention concerns in particular a substrate holder which is configured in such a way that it is suitable for a defined support of a substrate and thereby contributes to enhancing the measurement accuracy of the highly accurate measuring instrument.

BACKGROUND OF THE INVENTION

U.S. Pat. No. 5,671,054 discloses a method and an apparatus for determining the position of patterns on substrates that have a specific thickness. The substrate is placed onto a measurement stage that, in order to support the substrate, has three defined point-like support elements. The thickness of the substrate is determined using a reference substrate that is first measured. Then the substrate provided for measurement is measured. A data processing element then calculates the corresponding thickness differences from the differences between the reference substrate and the substrate to be measured, and incorporates them into the calculation for further determination of the position of the pattern. This arrangement has a considerable disadvantage, however, in that it is not very flexible, since only fixed mask sizes can be used or measured in this case. It is moreover problematic that if masks with different mask thicknesses need to be measured, the focal plane changes and is no longer located exactly on the surface of the substrate.

A substrate holder is also known from the article "Advanced Mask Metrology System for Up to 4 Gbit DRAM," published in SPIE, Vol. 3096-0277-786X/97, pages 433–444. This presents a universal substrate holder that has the support points or support elements arranged correspondingly on the substrate holder surface in accordance with the various sizes of the substrate types used. The support elements are configured such that they differ in height. For example, the support elements for the substrates with smaller dimensions are not as high as the support elements for substrates with larger dimensions. A disadvantage of this substrate holder is that it is not suitable for transmitted light.

SUMMARY OF THE INVENTION

It is therefore the object of the present invention to create a substrate holder that is suitable for measurement with transmitted light and makes available a defined support for the substrates.

According to the present invention this object is achieved by a substrate holder of a substrate that comprises
 a) a one-piece frame having a flat upper surface;
 b) an opening having a peripheral rim that is configured in the substrate holder; and
 c) three support elements that are shaped on the peripheral rim of the opening, on which are mounted spheres on which the substrate rests; and the spacing from the upper surface of the spheres to the flat upper surface of the substrate holder corresponds to the standard thickness of the substrate type being used.

A further object of the invention is to use the substrate holder in a highly accurate measurement system with which substrates can be measured in transmitted light; and that the substrate holders used for the purpose make available a defined support for the substrates and for determination of the deviation of a substrate thickness from a predefined standard thickness.

This object is achieved in that the substrate holder is suitable for determination of the deviation from standard thickness in the case of substrates of one type, and is used in a highly accurate measuring instrument.

The substrate holder according to the present invention and the use according to the present invention of the substrate holder make possible measurement of the substrate in both reflected and transmitted light. The substrate holders are configured in such a way that all the surfaces of the substrates to be measured lie at an identical height. This height is defined in such a way that the surfaces of the substrates lie in the Abbé plane, which minimizes Abbé errors. The substrate holders are configured as frames in which is defined an opening that is delimited by a peripheral rim. Support elements, on which point supports are configured, are provided on the peripheral rim of the opening. In a preferred exemplary embodiment, three support points are distributed correspondingly along the peripheral rim of the opening. The three-point support results in an exact calculation of the mask deflection, which makes possible exact calculation and correction of the position data. The substrate holders are configured such that a different substrate holder is used for each substrate type. The outside dimensions of each substrate holder are the same. The difference arises from the fact that in the substrate holders, the defined openings are correspondingly based on the size of the substrate type used. The support elements and the point supports thereby made available arc arranged on the peripheral rim of the openings in such a way that the flat upper surface of the substrate holder aligns with the surface of the substrate. Small deviations from the standard thickness of a substrate type can be corrected by focusing with the optical system of the measuring instrument first on the surface of the substrate and then on the flat upper surface of the substrate holder. From the difference in focal positions it is then possible to ascertain a thickness deviation of the substrate, which is then incorporated into the exact calculation of the mask deflection. A code that allows individual processing of the substrate holder by the measurement and correction software can also be mounted on the substrate holder. Long-term monitoring (drift monitoring and optionally also drift correction) is made possible by integrated reference points. In addition, the substrate holders can be configured such that the total weight of the substrate holder and substrate placed thereon is always approximately the same for the various substrate types. Distortions and deformations at the X/Y carriage and at the mirror body can thereby be kept constant to a first approximation. For this purpose, corresponding programs which correct these constant external influences are provided in a calculation unit of the measuring instrument.

BRIEF DESCRIPTION OF THE DRAWINGS

An exemplary embodiment of the invention will be explained below with reference to the drawings, in which.

DETAILED DESCRIPTION OF THE INVENTION

Figure 1:
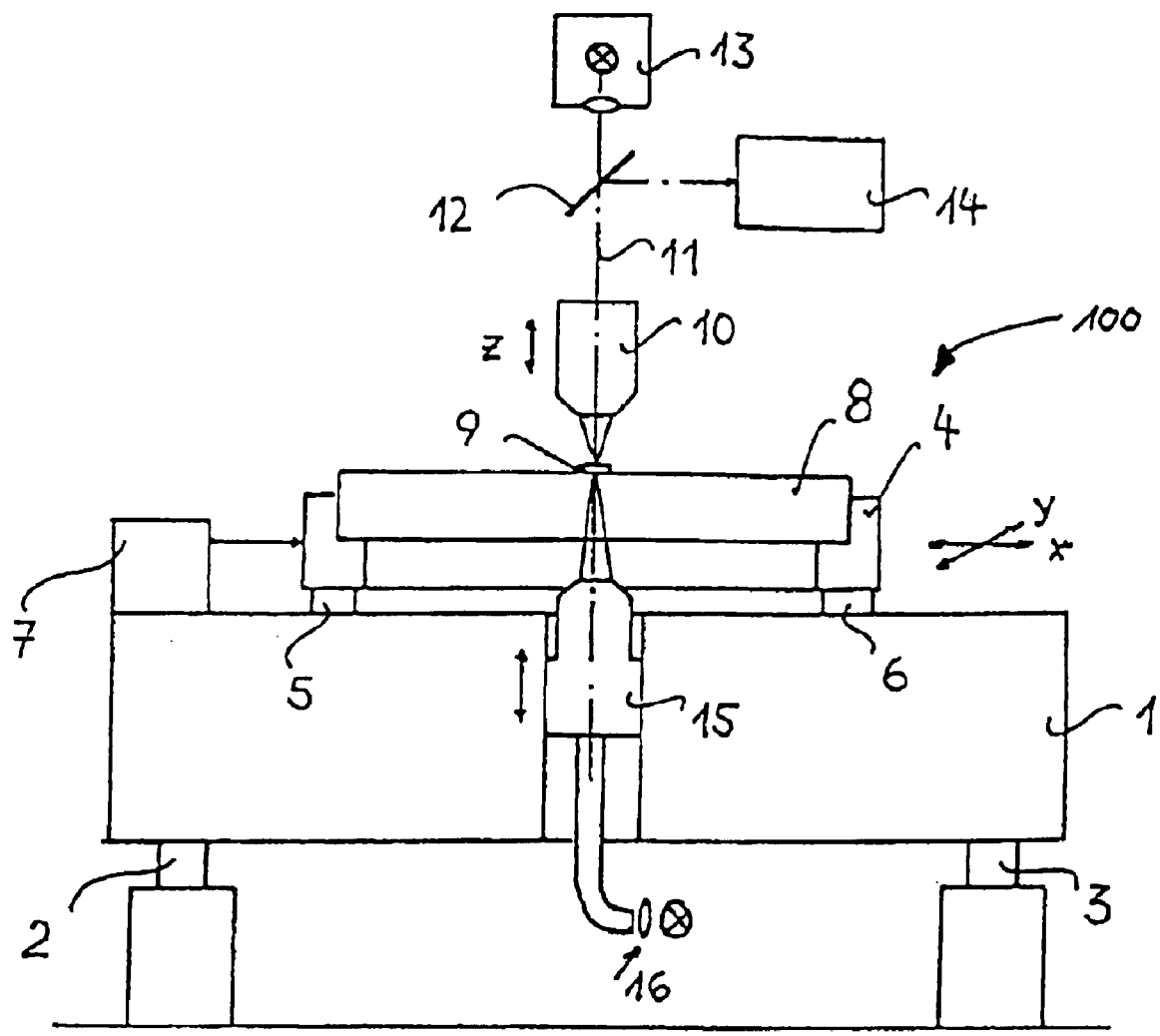
FIG. 1 shows a schematic side view of the measuring instrument.

The highly accurate measuring instrument 100 depicted in FIG. 1 comprises a granite block 1 that is mounted in vibration-damped fashion on bases 2, 3. Configured on granite block 1 is an X/Y carriage (not visible in this view) that is slidingly displaceable in two directions indicated by arrows. A mirror body 4 is placed on X/Y carriage, and advantageously is made of a glass ceramic with a low coefficient of thermal expansion. It is of course also possible to use other materials that possess thermal expansion properties appropriate for the accuracy of the measuring instrument. The drive systems for the X/Y carriage are not depicted. The positions of the X/Y carriage and of mirror body 4 are measured in the X and Y directions with a laser interferometer system 7.

A substrate holder 8 with substrate (not depicted) is placed into mirror body 4 of the X/Y carriage. The substrate is made, for example, of quartz glass. Patterns 9 are applied onto the substrate surface. Since mirror body 4 of the X/Y carriage is configured as a frame, the substrate can also be illuminated from below. For opaque substrates, illumination with incident light is then used. The description hereinafter is limited to the illumination of light-transmissive substrates. This is not in any way to be construed as a limitation of the protective scope of the Application.

Located above the substrate is an imaging system 10 of high optical quality that, for focusing, can be adjusted along its optical axis 11 in the Z direction. By way of a beam-splitting mirror 12, on the one hand the light of a light source 13 is introduced into the optical beam path, and on the other hand the imaging rays are directed to a detector device 14. Detector device 14 is, for example, a CCD camera having a high-resolution pixel array. Light source 13 emits in the near UV spectral region. Inserted into granite block 1 is a further illumination device that comprises an adjustable-height condenser 15 and a light source 16. The exit surface of a light guide can also be provided as light source 16. The optical axis of condenser 15 aligns with optical axis 11 of imaging system 10. The purpose of the height adjustment of condenser 15 with light source 16 is to adapt the imaging beam that is to be directed onto patterns 9 to different optical thicknesses of the substrates. The condenser head can, in particular, extend into the open portion of the frame of X/Y carriage.

Figure 2:
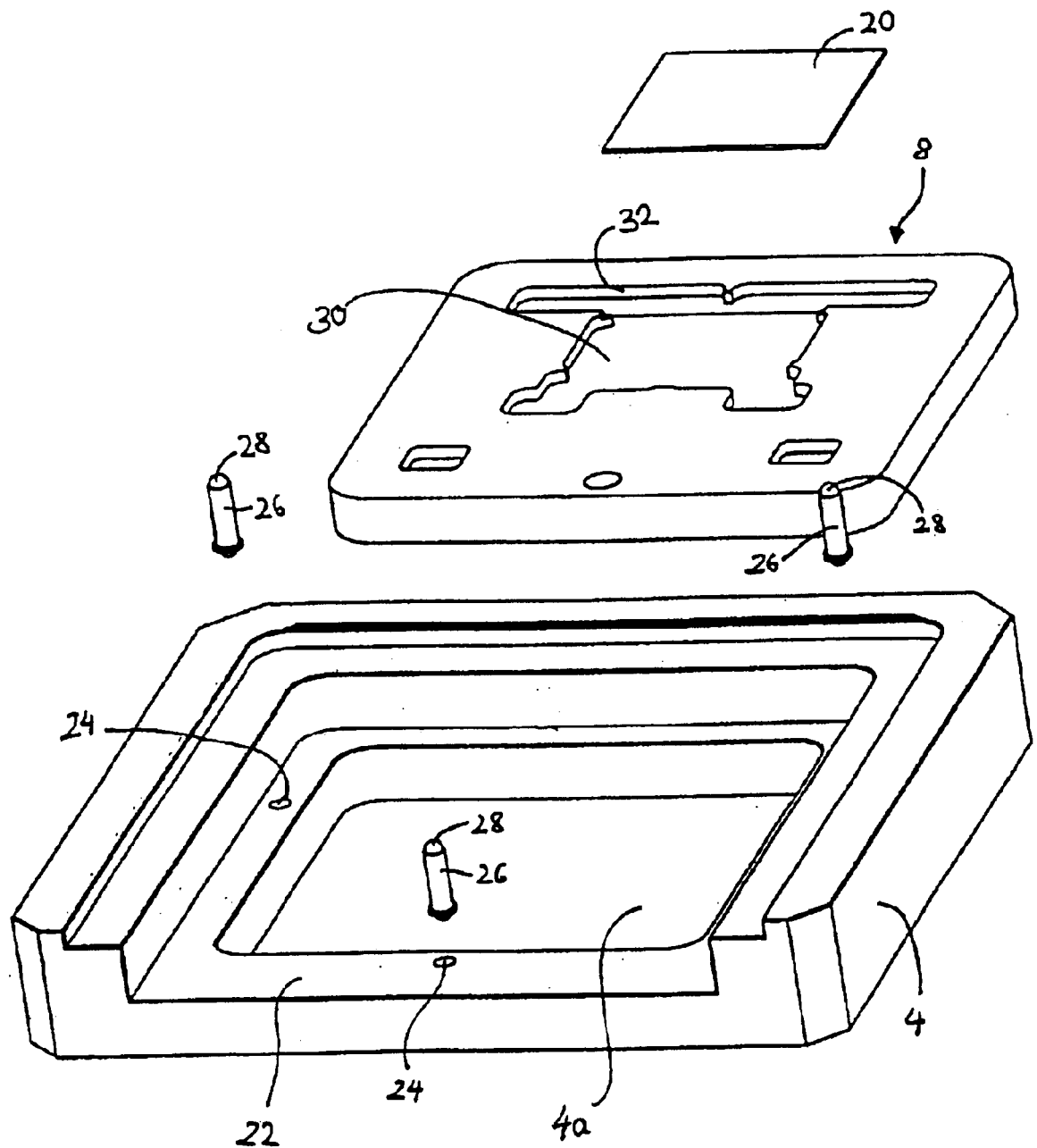
FIG. 2 shows a perspective depiction of the substrate, substrate holder, and mirror body of the X/Y carriage.

FIG. 2 shows, in a perspective depiction, the spatial relationship among mirror body 4 of X/Y carriage, substrate holder 8, and substrate 20. An opening 4a is shaped into mirror body 4. A rim 22 is configured around opening 4a. Multiple orifices 24, through which spacer pins 26 are inserted, are provided around rim 22. Spacer pins 26 each carry a spherical element 28 at one end. In the preferred exemplary embodiment, orifices 24 (three in number) are distributed on rim 22 in such a way that they lie at the vertices of an equilateral triangle. Substrate holder 8 is set into mirror body 4 and comes to rest on spherical protrusions 28 of spacer pins 26. In the exemplary embodiment depicted in FIG. 2, what is depicted is a type of substrate holder that is suitable for receiving a substrate 20 of one type. Substrate holders 8 for different substrate types have the same outside dimensions and differ only in the shape of an opening 30 that is shaped into substrate holder 8. Opening 30 in substrate holder 8 is configured in accordance with the size and type of substrate 20 being examined. Opening 30 of substrate holder 8 defines a peripheral rim 32 on which support elements for substrate 20 are shaped. Substrate 20 comes to rest on the support elements in such a way that the substrate underside is also freely accessible.

Figure 3:
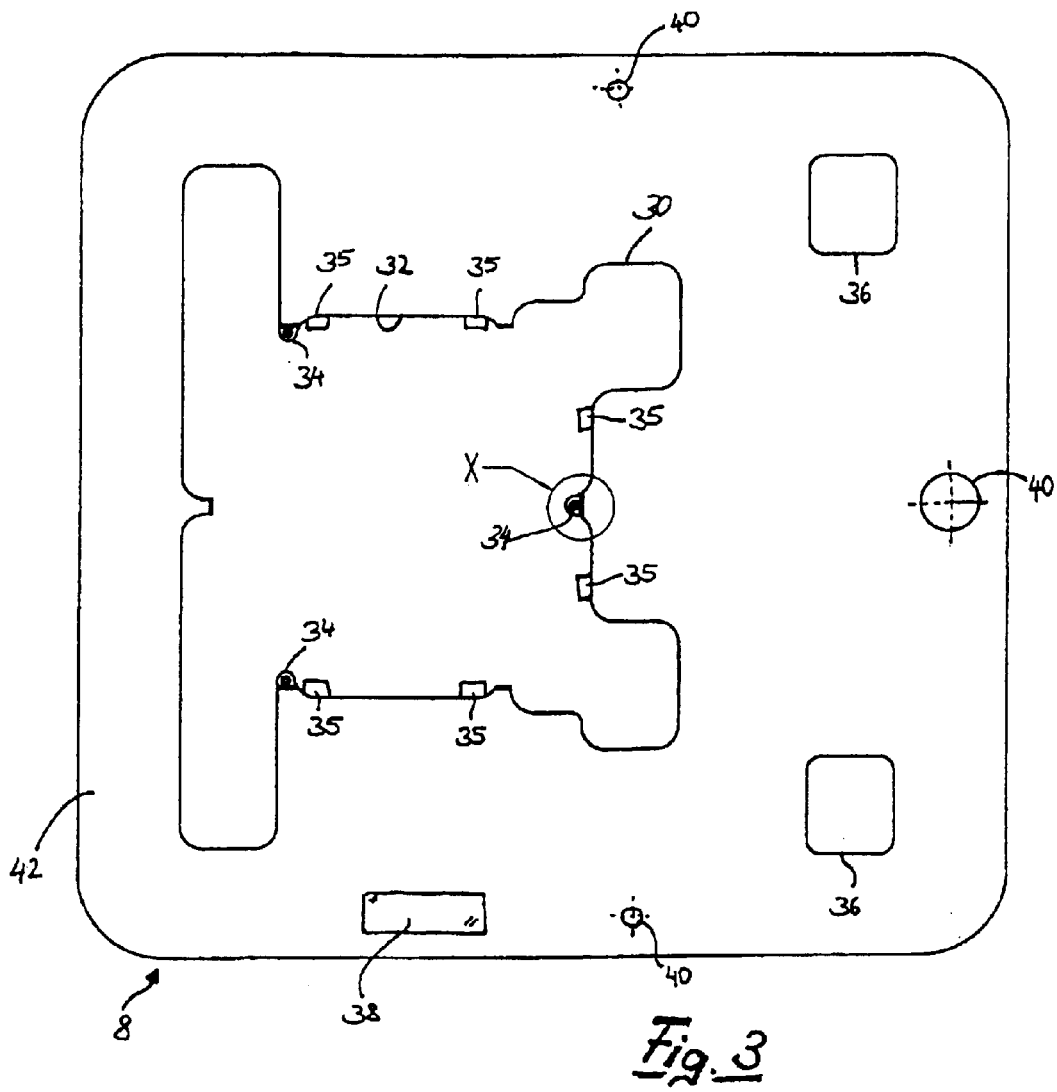
FIG. 3 shows a plan view of the substrate holder.

FIG. 3 shows a plan view of substrate holder 8 according to the present invention. Multiple support elements 34 are shaped onto peripheral rim 32 of opening 30. The circle labeled with the reference character "X" in FIG. 3 is shown as a detail in FIG. 5. Two further openings 36 that provide guidance during transport are provided in substrate holder 8. In the present exemplary embodiment, three support elements 34 are configured on peripheral rim 32 of opening 30. Support elements 34 are arranged such that they are located at the vertices of a notional equilateral triangle. Substrate holder 8 defines an upper surface 42 on which a code 38 is provided. In addition to the code, multiple reference marks 40 can be provided on upper surface 42. Code 38 can provide, for example, a type identifier for substrate holder 8. The type identifier can be provided in the form of a dot code, a dot matrix, a bar code, or a readable legend. The reference marks can be used for long-term monitoring in the context of drift monitoring and drift correction. Also applied on peripheral rim 32 of opening 30 are multiple reflective elements 35 that extend from rim 32 some distance into opening 30. These reflective elements 35 are used to determine the centrality of substrate 20 placed into substrate holder 8.

Figure 4:
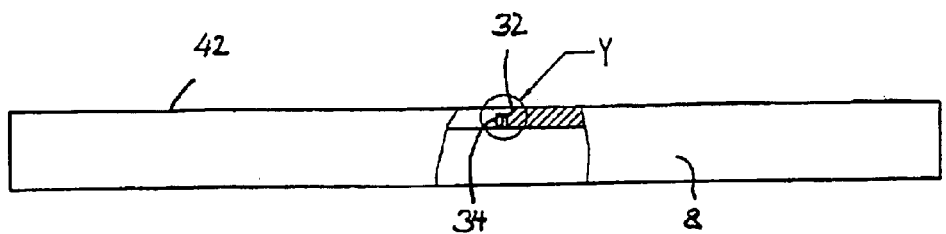
FIG. 4 shows a side view of the substrate holder to illustrate the location of the support elements.

FIG. 4 shows a side view of substrate holder 8, portions of the substrate holder having been omitted to allow a better view of the configuration of support elements 34. The circle labeled "Y" in FIG. 4 is depicted in enlarged fashion as a detail view in FIG. 6. Support elements 34. are configured in the form of lugs or projections on peripheral rim 32 of opening 30.

Figure 5:
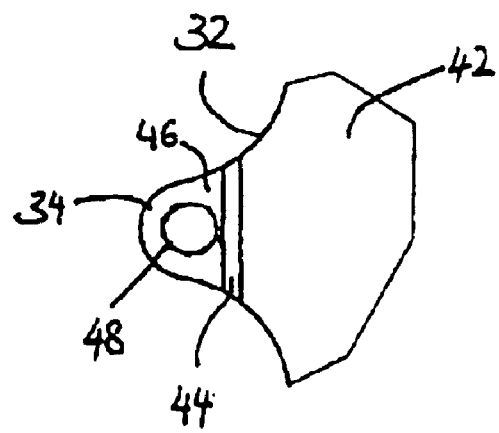
FIG. 5 shows a detail view of the region labeled "X" in FIG. 3.

FIG. 5 is the detail view of the region from FIG. 3. Support elements 34 are configured on peripheral rim 32 of opening 30. Support elements 34 lie lower than flat upper surface 42 of substrate holder 8. In the region of support element 34, peripheral rim 32 is equipped with a bevel 44 which thus facilitates the placement of a substrate 20 into opening 30 of substrate holder 8. Support element 34 also defines a flat upper surface 46. A spherical jewel 48, on which substrate 20 comes to rest with a small rim region, is set into flat upper surface 46.

Figure 6:
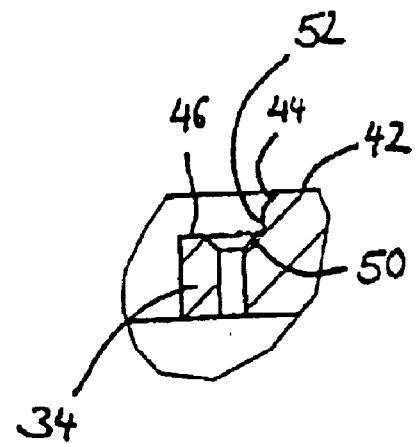
FIG. 6 shows a detail view of the region labeled "Y" in FIG. 4.

FIG. 6 shows the detail view from FIG. 4. From flat upper surface 42 of substrate holder 8, bevel 44 of peripheral rim 32 leads, in the region of support element 34, to a limit stop edge 52 that in turn terminates at flat upper surface 46 of support element 34. Configured in flat upper surface 46 of support element 34 is a circular depression 50 in which a spherical jewel (not depicted) is inserted. As already mentioned in connection with FIG. 5, the spherical jewels form the support points for substrate 20 placed into substrate holder 8. The spacing from the upper surface of spherical jewels 48 to flat upper surface 42 of the substrate holder is such that it corresponds substantially to the standard thickness of the substrate type which fits substrate holder 8. The expression "[corresponds] substantially to the standard thickness" means that the spacing corresponds to the standard thickness plus the thickness fluctuation defined by the standard. The standard applicable to substrates 20 is the SEMI standard (SEMI P1-92, © SEMI 1981, 1999).

The present invention has been described with reference to exemplary embodiments, but it is obvious to any person skilled in this art that modifications and variations can be made without thereby leaving the range of protection of the claims below.

Parts List

1 Granite block
2 Base
3 Base
4 Mirror body
5 Air bearing
6 Air bearing
7 Laser interferometer
8 Substrate Holder
9 Patterns
10 Imaging system
11 Optical axis
12 Beam-splitting mirror
13 Light source
14 Detector device
15 Adjustable-height condenser
16 Light source
20 Substrate
22 Rim
24 Orifice
26 Spacer pin
28 Spherical protrusion
30 Opening
32 Peripheral rim
34 Support element
35 Reflective elements
36 Further openings
38 Code
40 Reference marks
42 Flat upper surface
44 Bevel
46 Flat upper surface
48 Spherical jewel
50 Circular depression
52 Limit stop edge
100 Measuring instrument

What is claimed is:

1. A substrate holder (8) of a substrate (20), comprising:
   a) a one-piece frame having a flat upper surface (42);
   b) an opening (30) having a peripheral rim (32) that is configured in the substrate holder; and
   c) three support elements (34) that are shaped on the peripheral rim (32) of the opening (30), on which are mounted spheres on which the substrate (20) rests; and
   d) wherein a spacing from the upper surface of the spheres to the flat upper surface (42) of the substrate holder (8) is substantially equal to a standard thickness of the substrate type being used, said spacing thereby defining a calibrating spacing for said standard thickness.

2. The substrate holder as defined in claim 1, wherein the size of the opening (30) in the substrate holder (8) corresponds in each case substantially to the size of the substrate type being used.

3. The substrate holder as defined in claim 1, wherein the spheres provided on the support elements (34) are spherical jewels (48), each of which constitutes a point-like support for the substrate (20).

4. The substrate holder as defined in claim 3, wherein the point-like supports are arranged on the peripheral rim (32) of the opening (30) in such a way that the point-like supports form the vertices of an equilateral triangle.

5. The substrate holder as defined in claim 1, wherein reflective elements (35) are mounted on the peripheral rim (32) of the substrate holder (8) in such a way that they extend into the opening (30) of the substrate holder (8).

6. The substrate holder as defined in claim 1, wherein the outside dimensions of the substrate holder (8) are the same for all substrate types; and the opening (30) is configured with respect to the size of the substrate type being used.

7. The substrate holder as defined in claim 1, wherein a code (38) is provided on the flat upper surface (42) of the substrate holder (8).

8. The substrate holder as defined in claim 7, wherein the code (38) is a dot code, a dot matrix, a bar code, or a readable legend.

9. The substrate holder as defined in claim 1, wherein at least one reference mark (40) is provided on the flat upper surface (42) of the substrate holder (8).

10. The substrate holder as defined in claim 1, further comprising a mirror body of an X/Y carriage, wherein the substrate holder (8) is insertable into the mirror body (4) of the X/Y carriage, there being defined in the mirror body (4) an opening around which is provided a rim (22) on which multiple spacer pins (26), each having a spherical protrusion (28), are mounted, so that the substrate holder (8) rests on the spherical protrusions (28).

11. The substrate holder as defined in claim 10, wherein the spacer pins (26) are distributed on the peripheral rim (22) of the mirror body (4) in such a way that they are provided at the vertices of an equilateral triangle.

12. Use of the substrate holder as defined in claim 1 in a measuring instrument, wherein the substrate holder (8) interacts with the measuring instrument in order to determine a deviation from the standard thickness for substrates of one type.

13. The use of the substrate holder as defined in claim 12, wherein the size of the opening (30) in the substrate holder (8) corresponds in each case substantially to the size of the substrate type being used.

14. The use of the substrate holder as defined in claim 12, wherein the sphere provided on the support elements (34) are spherical jewels (48), each of which constitutes a point-like support for the substrate (20).

15. The use of the substrate holder as defined in claim 14, wherein the point-like supports are arranged on the peripheral rim (32) of the opening (30) in such a way that the point-like supports form the vertices of an equilateral triangle.

16. The use of the substrate holder as defined in claim 12, wherein the outside dimensions of the substrate holder (8) are the same for all substrate types; and the opening (30) is configured with respect to the size of the substrate type being used.

17. The use of the substrate holder as defined in claim 12, wherein a code (38) is provided on the flat upper surface (42) of the substrate holder (8).

18. The use of the substrate holder as defined in claim 17, wherein the code (38) comprises a dot code, a dot matrix, a bar code, or a readable legend.

19. The use of the substrate holder as defined in claim 12, wherein at least one reference mark (40) is provided on the flat upper surface (42) of the substrate holder (8).

20. The use of the substrate holder as defined in claim 12, further comprising a mirror body of an X/Y carriage of the measuring instrument, wherein the substrate holder (8) is insertable into the mirror body (4) of the X/Y carriage, there being defined in the mirror body (4) an opening around which is provided a rim (22) on which multiple spacer pins (26) having a spherical protrusion (28) are mounted, so that the substrate holder (8) rests on the spherical protrusions (28).

21. The use of the substrate holder as defined in claim 20, wherein the spacer pins (26) are distributed on the peripheral rim (22) of the mirror body (4) in such a way that they are provided at the vertices of an equilateral triangle.

* * * * *